(12) United States Patent
Sato (10) Patent No.: US 8,347,024 B2
(45) Date of Patent: Jan. 1, 2013

(54) MEMORY SYSTEM MONITORING DATA ERASING TIME OR WRITING TIME

(75) Inventor: Takeaki Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 12/752,525

(22) Filed: Apr. 1, 2010

(65) Prior Publication Data

US 2011/0078402 A1 Mar. 31, 2011

(30) Foreign Application Priority Data

Sep. 25, 2009 (JP) ................................ 2009-220164

(51) Int. Cl.
*G06F 13/00* (2006.01)
(52) U.S. Cl. ................................. 711/103; 711/E12.008
(58) Field of Classification Search .................... None
See application file for complete search history.

(56) References Cited

U.S. PATENT DOCUMENTS

| 2008/0294938 | A1* | 11/2008 | Kondo | 714/24 |
| 2011/0022784 | A1* | 1/2011 | Yano et al. | 711/103 |
| 2011/0228605 | A1* | 9/2011 | Suzuki et al. | 365/185.09 |

FOREIGN PATENT DOCUMENTS

| JP | 6-52694 | 2/1994 |
| JP | 6-124596 | 5/1994 |
| JP | 7-28690 | 1/1995 |
| JP | 7-281842 | 10/1995 |
| JP | 2001-28191 | 1/2001 |
| JP | 2007-94734 | 4/2007 |
| JP | 2007-316779 | 12/2007 |
| JP | 2008-276832 | 11/2008 |
| JP | 2008-293555 | 12/2008 |
| WO | WO 96/28826 A1 | 9/1996 |
| WO | WO 2008/066058 A1 | 6/2008 |

OTHER PUBLICATIONS

Notice of Rejection issued Feb. 20, 2012 in Japanese Patent Application No. 2009-220164 (with English translation).
U.S. Appl. No. 13/240,014, filed Sep. 22, 2011, Nagashima.
Japanese Office Action issued Aug. 30, 2011, in Patent Application No. 2009-220164 (with English-language translation).
U.S. Appl. No. 13/049,417, filed Mar. 16, 2011, Abe.

* cited by examiner

*Primary Examiner* — Edward Dudek, Jr.
*Assistant Examiner* — Sean D Rossiter
(74) *Attorney, Agent, or Firm* — Oblon, Spivak, McClelland, Maier & Neustadt, L.L.P.

(57) ABSTRACT

A memory system includes a non-volatile semiconductor memory that includes a plurality of blocks, each of the blocks being a data erasing unit; an erasing time monitoring unit that monitors time required for erasing data from the non-volatile semiconductor memory; a management table for managing the erasing time on a unit of each of the blocks; and a wear-leveling control unit that levels number of rewriting across the blocks based on the management table. The memory system accommodates variations among lots, individual pieces, and blocks, thereby performing highly-accurate wear leveling.

20 Claims, 8 Drawing Sheets

| BLOCK ID | WRITING TIME Tw | ERASING TIME Te | NUMBER OF REWRITING k |
|---|---|---|---|
| 1 | ... | ... | ... |
| 2 | ... | ... | ... |
| ⋮ | ⋮ | ⋮ | ⋮ |

MEMORY SYSTEM MONITORING DATA ERASING TIME OR WRITING TIME

CROSS-REFERENCE TO RELATED APPLICATIONS

This application is based upon and claims the benefit of priority from the prior Japanese Patent Application No. 2009-220164, filed on Sep. 25, 2009; the entire contents of which are incorporated herein by reference.

BACKGROUND OF THE INVENTION

1. Field of the Invention

The present invention relates to a memory system that includes a non-volatile semiconductor memory.

2. Description of the Related Art

A NAND flash memory is a semiconductor memory that requires erase operation before writing operation. A life of the semiconductor memory depends on a number of times of rewriting. Write/erase to and from a NAND flash memory is performed by applying a high voltage across a substrate and a control gate, thereby injecting/releasing electrons into/from a floating gate. Performing this operation a number of times degrades a gate oxide film around the floating gate and allows electrons injected into the floating gate to dissipate, which disadvantageously results in data loss. In other words, as a number of rewriting increases, a period of time (retention) over which data is held after rewrite becomes shorter (degradation of retention characteristic).

Meanwhile, data stored in a host apparatus, such as a personal computer, has both temporal locality and spatial locality. Accordingly, when data is stored to an address specified by a host apparatus without changing the address repeatedly, rewrite or erase operations are concentrated to a specific area in a short period of time, thereby increasing deviation in numbers of times of erasing over addresses. To this end, in a NAND flash memory, a technique of what is called wear leveling of evenly distributing data update locations is typically performed.

BRIEF SUMMARY OF THE INVENTION

A memory system according to an embodiment of the present invention includes a non-volatile semiconductor memory that includes a plurality of blocks, each of the blocks being a data erasing unit; an erasing time monitoring unit that monitors time required for erasing data from the non-volatile semiconductor memory; a management table for managing the erasing time on a unit of each of the blocks; and a wear-leveling control unit that levels number of rewriting across the blocks based on the management table.

DETAILED DESCRIPTION OF THE INVENTION

In wear leveling, in order to prevent from concentrating writing and erasing of data to a specific erase unit (block), a number of rewriting is allowed to distribute evenly over blocks. For controlling the number of rewriting, numbers of writing and erasing are used (see, e.g., JP-A No. 2008-276832 (KOKAI)). JP-A No. 2008-276832 (KOKAI) discloses that physical addresses of blocks in which a number of erasing (writing) exceeds a predetermined number are changed with physical addresses of blocks in which a number of erasing (writing) is small.

However, endurance in numbers of writing and erasing exhibits a certain variation not only among device types but also among lots, individual pieces, blocks, and the like, even in the same device type. Therefore, conventional wear leveling control based on numbers of writing and erasing is disadvantageous in having difficulty in performing highly-accurate wear leveling control because there can be a case where degradation occurs at smaller numbers of writing and erasing than an assumed numbers thereof and vice versa, and the like.

Exemplary embodiments of a memory system according to the present invention will be described in detail below with reference to the accompanying drawings. It should be understood that the present invention is not limited to these exemplary embodiments.

(First Embodiment)

Figure 1:
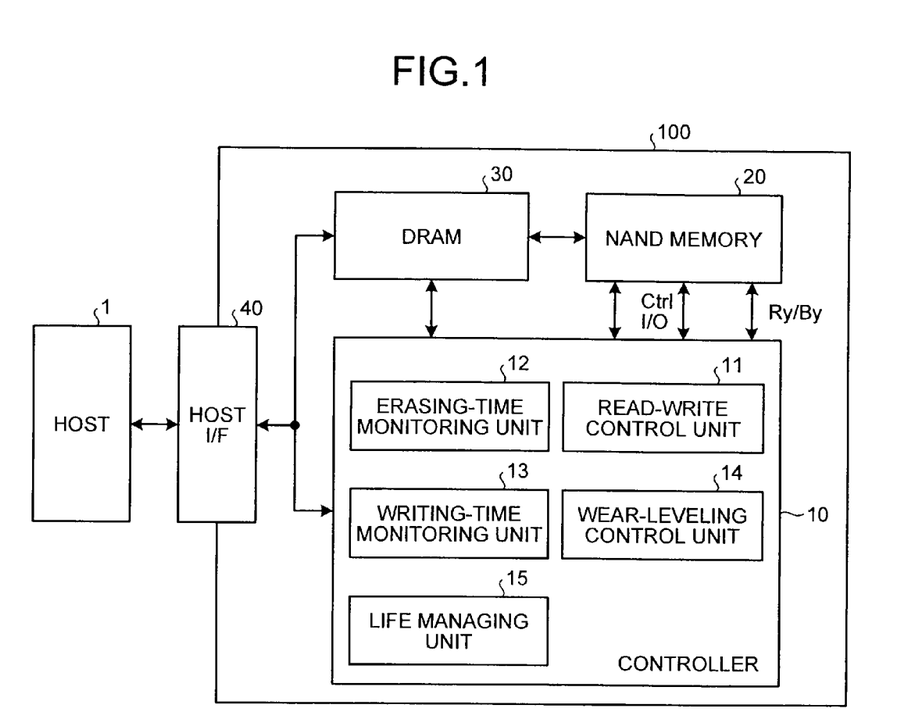
FIG. 1 is a block diagram illustrating a system configuration of a memory system according to an embodiment of the present invention.

FIG. 1 is a block diagram illustrating a configuration example of an SSD (solid state drive) 100 serving as a memory system according to a first embodiment of the present invention. The SSD 100 includes a controller 10, a NAND flash memory (hereinafter, abbreviated as NAND memory) 20 serving an example of a non-volatile semiconductor memory, a DRAM (dynamic random access memory) 30 serving as an example of a volatile semiconductor memory, a host connection interface (host I/F) 40 for use in connection to a host apparatus 1, and the like. The SSD 100 is connected to the host apparatus (hereinafter, abbreviated as host) 1, such as a personal computer or a CPU (central processing unit) core, via the host I/F 40 and functions as an external memory of the host 1.

The NAND memory 20 stores therein user data specified by the host 1 and management information managed in the DRAM 30 for backup. The NAND memory 20 includes a memory cell array formed with a plurality of memory cells arranged in a matrix. Each of the memory cells is capable of storing multiple values by using an upper page and a lower page. The NAND memory 20 includes a plurality of NAND memory chips, each of which is formed with a plurality of physical blocks, each of which corresponds to a unit of data erasing. Data writing and reading to and from the NAND memory 20 are performed per a physical page basis. The physical block is formed with a plurality of the physical pages.

A physical block address is a fixed address assigned to each physical block. A logical block address is an address specified by the host 1 or a changeable address assigned to a logical block, which is a virtual block. The logical block refers to, for instance, a virtual block formed by combining a plurality of physical blocks together.

The DRAM 30 is used as a storage unit for data transfer and for storing management information. Specifically, the storage unit (cache area for data transfer) for data transfer is used in, in response to a write request issued by the host 1, temporarily storing requested data before the data is written to the NAND memory 20, in response to a read request issued by the host 1, reading requested data from the NAND memory 20 and temporarily storing the data, or the like. Usages as the storage unit for storing management information include storing management information, such as management information (correspondences between logical addresses and physical addresses, and the like) for use in managing locations where data is stored in the NAND memory 20, and management information for use in managing writing time Tw and erasing time Te on a physical block basis.

Figure 2:
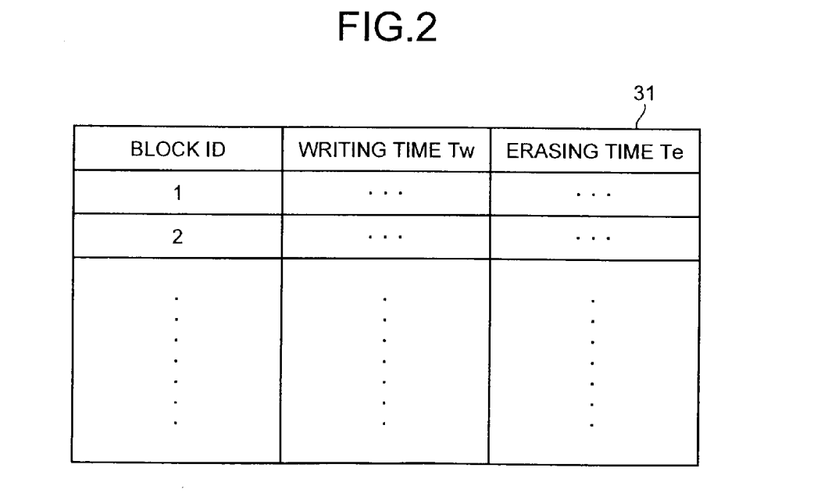
FIG. 2 is a diagram illustrating management data provided in a writing/erasing time management table.

The NAND memory 20 stores a writing/erasing-time management table 31, of which example is illustrated in FIG. 2. The writing/erasing-time management table 31 is read out from the NAND memory 20 at system start-up and stored in the DRAM 30. The writing/erasing-time management table 31 is a table for use in managing writing time Tw, which is a period of time required to perform writing, and erasing time Te, which is a period of time required to perform erasing, on a physical-block basis (on a physical-block address basis). The writing/erasing-time management table 31 contains, as the writing time Tw and the erasing time Te, latest, actually-monitored periods of time.

The controller 10 controls data transfer between the host 1 and the NAND memory 20 via the DRAM 30 and controls elements in the SSD 100. The controller 10 and the NAND memory 20 are connected to each other via a control I/O line (Ctrl I/O), through which a command, an address, data, and the like are to be input or output. The controller 10 receives an input of a ready/busy signal (Ry/By) that indicates whether the NAND memory 20 is in a ready state or a busy state from the NAND memory 20. The controller 10 includes a read-write control unit 11, an erasing time monitoring unit 12, a writing time monitoring unit 13, a wear-leveling control unit 14, and a life managing unit 15.

The read-write control unit 11 controls reading and writing of data from and to the NAND memory 20 based on management information stored in the DRAM 30 via the cache area in the DRAM 30.

Figure 3:
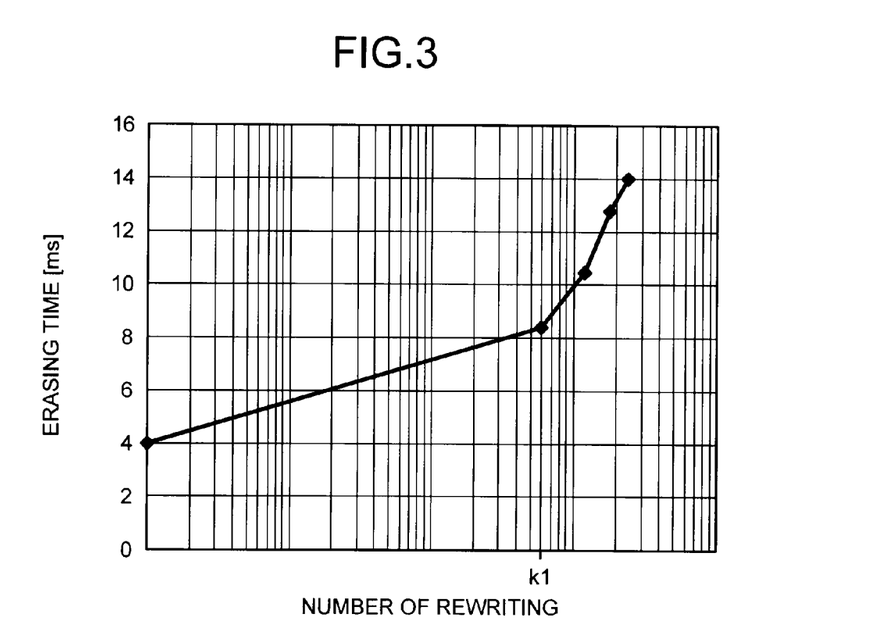
FIG. 3 is a diagram illustrating a relationship between a number of rewriting and erasing time.

The erasing time monitoring unit 12 measures erasing time Te of each physical block for every erasing from a physical block in the NAND memory 20 or at predetermined intervals or frequency. FIG. 3 is a diagram illustrating a relationship between a number of rewriting and erasing time Te. This diagram depicts average values obtained from verification data about a large number of physical blocks. According to the diagram, erasing time, which is four milliseconds at an initial state, increases as the number of rewriting increases. In the neighborhood where the number of rewriting exceeds k1, the erasing time begins to exceed eight milliseconds and erasing characteristics deteriorate sharply, which can be interpreted that degradation has started. Accordingly, history of the erasing time Te teaches to what degree the block has degraded, therefore, the erasing time can be used as the reference for selection of a target block for wear leveling.

Figure 4:
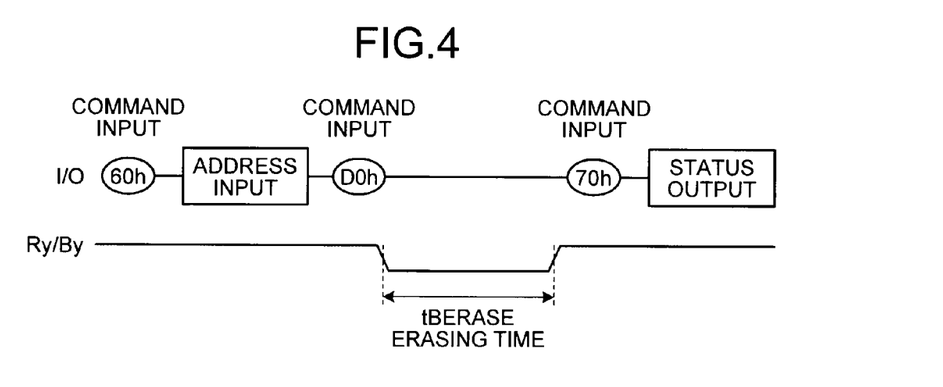
FIG. 4 is a time chart illustrating a sequence of an erasing operation.

FIG. 4 is a time chart illustrating an operational sequence of erasing operation. In the erasing operation, an erase command "60h," an address, and a command "D0h" are input via the control I/O line to perform the erasing operation. During the course of the erasing operation, the ready/busy signal (Ry/By) is fallen to busy. When the erasing operation ends, the ready/busy signal (Ry/By) rises to ready and a command "70h" is input via the control I/O line. In response thereto, a status signal (normal end, abnormal end, or the like) is output.

The erasing time monitoring unit 12 monitors the ready/busy signal (Ry/By) after the erase command "60h" has been input to measure a period of time (tBERASE) elapsed between fall of the ready/busy signal (Ry/By) to busy and rise to ready as the erasing time Te, and places the thus-measured erasing time Te to a corresponding physical block entry in the writing/erasing-time management table 31.

Figure 5:
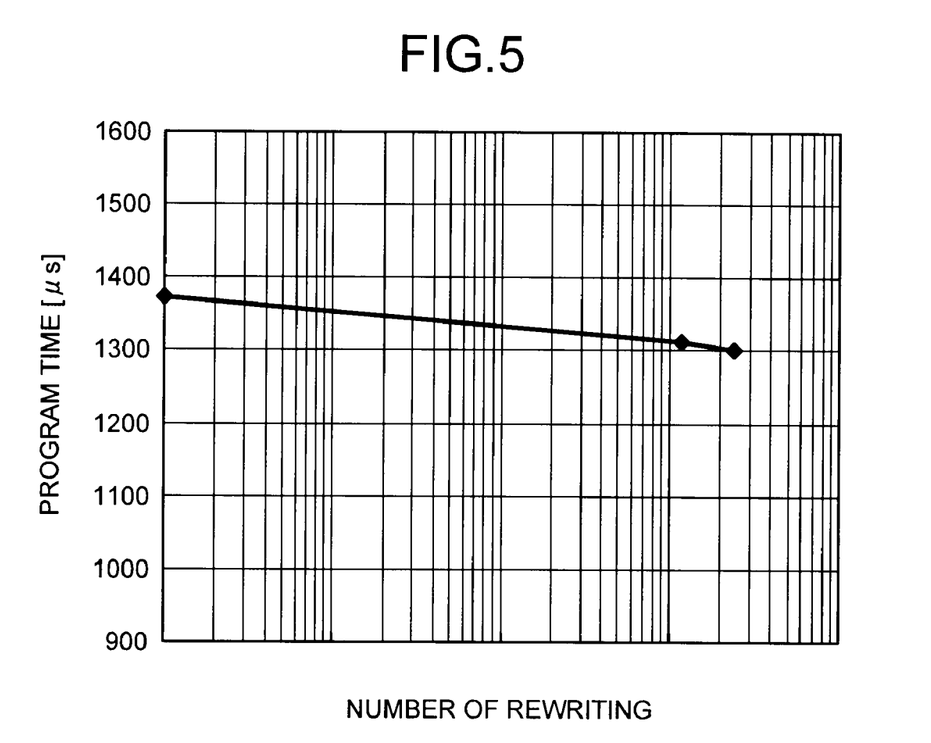
FIG. 5 is a diagram illustrating a relationship between a number of rewriting and program time.

The writing time monitoring unit 13 measures writing time Twp of each physical page for every writing to a physical page or at predetermined intervals or frequency. FIG. 5 is a diagram illustrating a relationship between a number of rewriting and program time Twp. This diagram depicts average values obtained from verification data about a large number of physical pages. According to the diagram, writing time Twp gradually decreases as the number of rewriting increases. Accordingly, history of the writing time teaches to what degree a block has degraded, therefore, the writing time can be used as the reference for selection of a target block for wear leveling.

Figure 6:
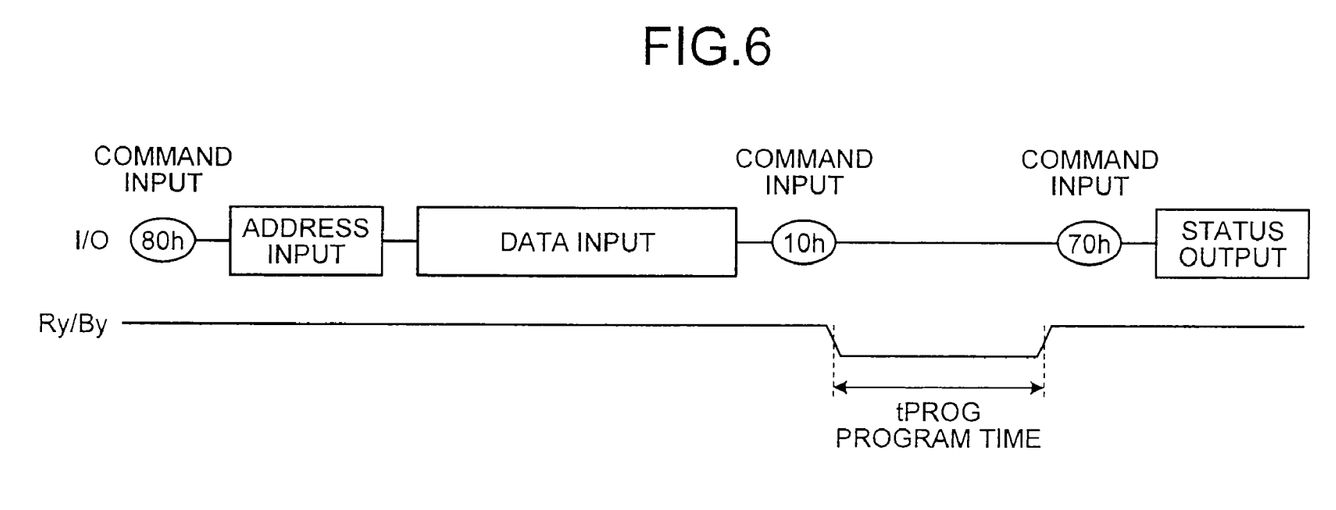
FIG. 6 is a time chart illustrating a sequence of a program operation.

FIG. 6 is a time chart illustrating an operational sequence of program operation. In the writing operation, a write command "80h," an address, data, and a command "10h" are input via the control I/O line to perform the writing operation. During the writing operation, the ready/busy signal (Ry/By) is fallen to busy. When the writing operation ends, the ready/busy signal (Ry/By) rises to ready and the command "70h" is input via the control I/O line. In response thereto, a status signal (normal end, abnormal end, or the like) is output.

The writing time monitoring unit 13 monitors the ready/busy signal (Ry/By) after the write command "80h" has been input to measure, as page writing time Twp, a period of time (tPROG) elapsed between fall of the ready/busy signal (Ry/By) to busy and rise to ready. In this manner, the writing time monitoring unit 13 measures page writing time Twp of each page and converts the thus-measured page writing time Twp into writing time Tw for a unit of the physical block. As technique for obtaining writing time Tw for a unit of the physical block, any one of the following techniques can be employed:

calculate average value of page writing time Twp of pages in the physical block;

adopt the shortest page writing time (i.e., of a page most degraded with time) as writing time Tw of the physical block; and adopt page writing time of a predetermined physical page, which has been set in advance, as writing time Tw of the physical block.

The writing time monitoring unit 13 places the thus-obtained writing time Tw to an entry of corresponding physical block in the writing/erasing-time management table 31.

Figure 7:
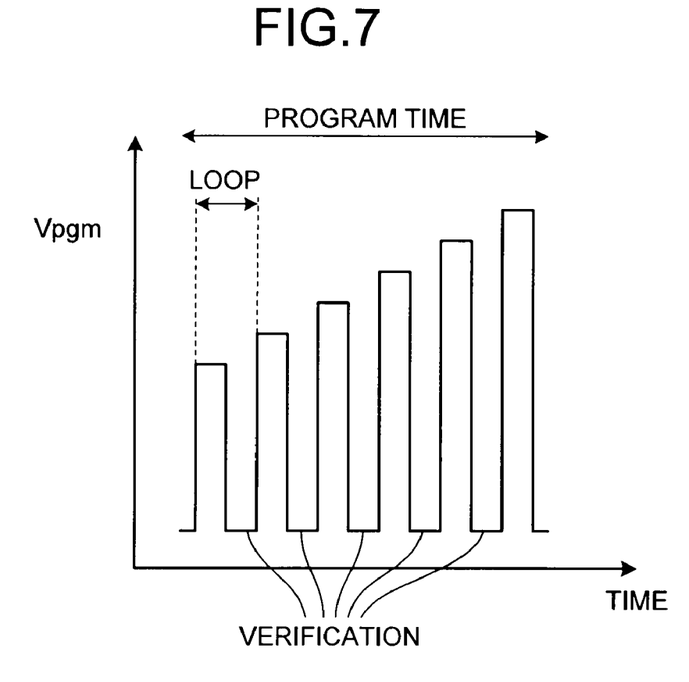
FIG. 7 is a time chart illustrating an application operation of program voltage.

Alternatively, writing time Tw may be measured by using n, a number of repeating times (hereinafter, referred to as a number of loops) of voltage application during writing. When performing writing, as illustrated in FIG. 7, verification is performed to determine whether the writing has been performed successfully every time a writing voltage Vpgm is applied to a memory cell. If the writing has not been performed successfully, increasing the writing voltage Vpgm and performing the verification operation are repeated until the writing has been performed successfully or the writing has been reached to its end of time. Accordingly, the number of loops n can be used in place of writing time Tw. Also in erasing operation, similar control is performed by repeating the cycle of applying erasing voltage and performing verification; therefore, a number of loops can be used in place of erasing time. However, because the number of loops in erasing operation is generally small, the number of loops n is more effectively used as a substitute for writing time.

The wear-leveling control unit 14 performs wear leveling control by using the writing/erasing-time management table 31 stored in the DRAM 30. The wear leveling control is performed by leveling the number of rewriting across blocks and includes dynamic wear leveling and static wear leveling. In the dynamic wear leveling, writing and erasing are performed priorly to a block of which number of rewriting is small. In the static wear leveling, blocks that have not been rewritten for long period of time and hence have small number of rewriting are replaced with blocks having large number of rewriting. The wear-leveling control unit 14 selects a target block by using writing time Tw and erasing time Te of each of the physical blocks registered in the writing/erasing-time management table 31 and performs dynamic and static wear levelings. Which one of writing time Tw and erasing time Te is to be used, or both of them are to be used in performing the dynamic and static wear levelings have been set in advance based on a type of a device. In the following description, it is assumed that erasing time Te is to be used.

Figure 8:
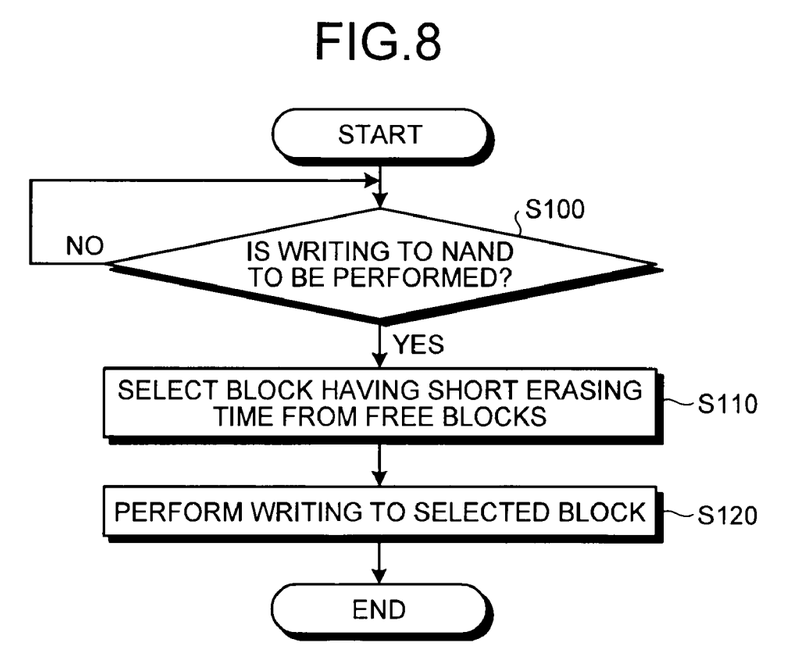
FIG. 8 is a flowchart illustrating a procedure of dynamic wear leveling.

A method of dynamic wear leveling will be described with reference to the flowchart illustrated in FIG. 8. If a new data writing request is issued by the host 1 (Step S100), the wear-leveling control unit 14 selects a block, of which erasing time Te is shortest from among unassigned, free physical blocks, each of which not containing valid data, by referring the writing/erasing-time management table 31 (Step S110). The wear-leveling control unit 14 reports the thus-selected block having the shortest erasing time Te to the read-write control unit 11. The read-write control unit 11 performs data writing to the thus-reported block having the shortest erasing time Te (Step S120). Dynamic wear leveling control that uses writing time Tw as the reference for block selection can be also performed in a similar manner. Meanwhile, dynamic wear leveling can be performed with various methods other than those described with reference to FIG. 8, and the present invention may be applied to such other dynamic wear leveling methods.

Figure 9:
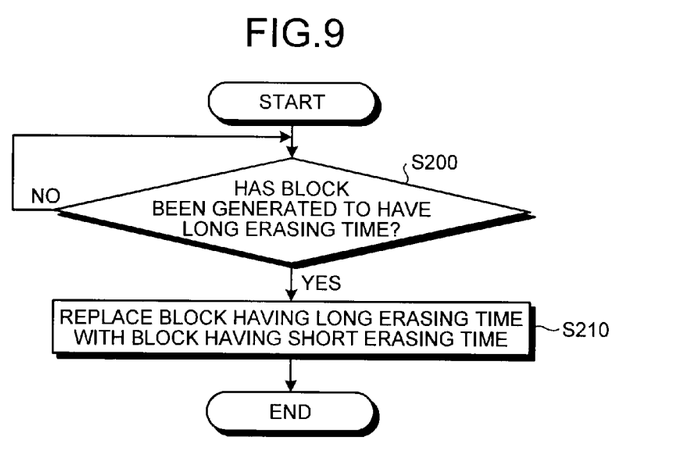
FIG. 9 is a flowchart illustrating a procedure of static wear leveling.

Subsequently, a method of static wear leveling will be described with reference to the flowchart illustrated in FIG. 9. The wear-leveling control unit 14 monitors erasing time Te of each of the blocks registered in the writing/erasing-time management table 31, and, if it is detected that a block having erasing time longer than a predetermined threshold value has generated (Step S200), replaces the block, of which erasing time has exceeded the threshold value, with a block having shortest erasing time (Step S210).

For instance, it is assumed that valid data is written to a block having physical block address "BP1" and logical block address "BL2" and of which erasing time has exceeded a threshold value, and effective data is written in the block. On the other hand, it is assumed that a block having shortest erasing time is a free block (a block that does not contain valid data) and physical block address of this free block is "BP3." The wear-leveling control unit 14 erases invalid data in the free block "BP3," writes to this free block "BP3" the valid data held in the block "BP1" via the DRAM 30, and changes the logical block address of the block "BP3" to "BL2." The wear-leveling control unit 14 further sets the physical block "BP1" to a free block and invalidates the logical block address of this block. Moving data and logical address remapping can be performed in a similar manner also in a case where valid data is written to each of a block, of which erasing time has exceeded the threshold value, and to a block having shortest erasing time.

Meanwhile, when performing block selection by using writing time Tw as the reference, similar static leveling is to be performed. Alternatively, the static wear leveling may be performed only when erasing time has increased by a percentage of a predetermined value relative to erasing time Te at an initial state where the number of rewriting is zero, or when writing time has decreased by a percentage of a predetermined value relative to writing time Tw at an initial state where the number of rewriting is zero. When performing static wear leveling by using both of writing time Tw and erasing time Te, the static wear leveling may be performed such that determinations about both of the writing time Tw and the erasing time Te are made at the determination at Step S200, and the static wear leveling is performed when one of the writing time Tw and the erasing time Te has exceeded the threshold value for the static wear leveling. Meanwhile, static wear leveling can be performed with various methods other than those described with reference to FIG. 9, and the present invention may be applied to such other dynamic wear leveling methods.

The life managing unit 15 determines about a life of the SSD 100 based on data registered in the writing/erasing-time management table 31, and when it is determined that the SSD has reached the end of its life, outputs warning thereabout to the host 1. Specifically, for instance, the life managing unit 15 calculates average values of writing time Tw and erasing time Te of the physical blocks registered in the writing/erasing-time management table 31, and when the average value of writing time Tw has become shorter than a predetermined threshold value for use in life management, when the average value of erasing time Te has become longer than a predetermined threshold value for use in life management, or when the SSD is determined to have reached the end of its life, outputs a warning thereabout to the host 1. As the threshold value for use in life management related to writing time Tw, a value smaller than the threshold value for writing time Tw to be used at Step S200 in the static wear leveling discussed earlier is to be used. As the threshold value for use in life management related to erasing time Te, a value larger than the threshold value for erasing time Te to be used at Step S200 in the static wear leveling discussed earlier is to be used.

In the above discussion, whether the end of life has come is determined based on the average value; however, determination as to whether the end of life has come may alternatively be made based on comparison between writing time Tw and/or erasing time Te of a block that is determined to have smallest degradation with time, with a threshold value for use in life management. Specifically, the end of life has come can be determined when writing time Tw of a block having longest writing time has become shorter than a predetermined threshold value for use in life management, or when erasing time Te of a block having shortest erasing time has become longer than a predetermined threshold value for use in life management. Alternatively, the end of life has come may be determined when a percentage of the number of blocks determined to have degraded with time by a small degree based on writing time Tw and/or erasing time Te has become smaller than a predetermined percentage.

As discussed above, according to the present embodiment, wear leveling is performed based on actually-monitored erasing time and/or writing time. This allows to perform highly-accurate wear leveling that is not affected by variations among lots, individual pieces, blocks, and the like but adjusted according to the degree of degradation of each piece and block. Because determination about life is made based on actually-monitored erasing time and/or writing time, accurate determination about life can be made without being affected by variations among lots, individual pieces, blocks, and the like.

Figure 10:
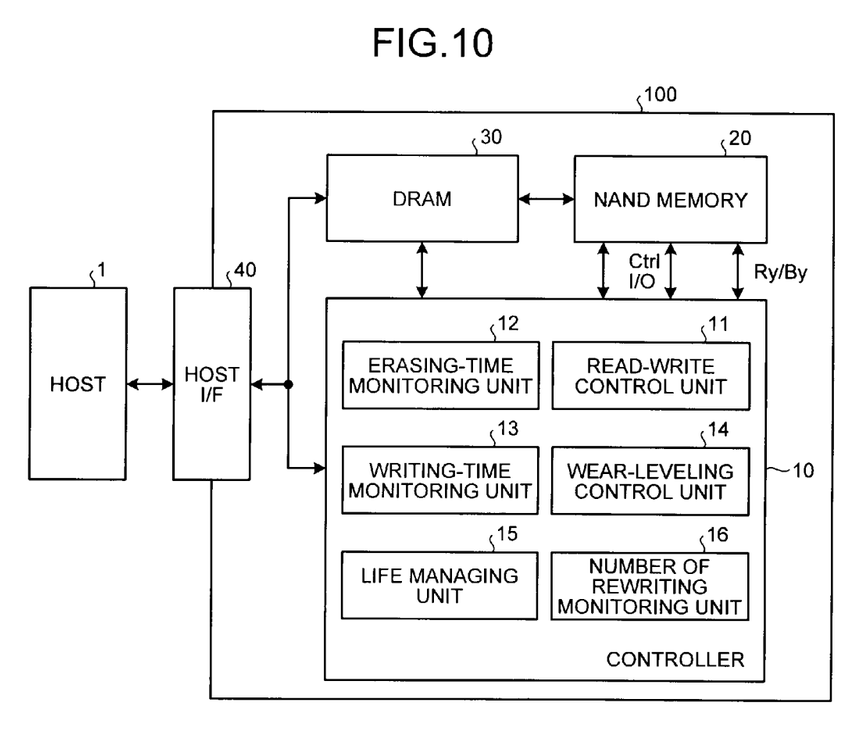
FIG. 10 is a block diagram illustrating a system configuration of another memory system.
Figure 11:
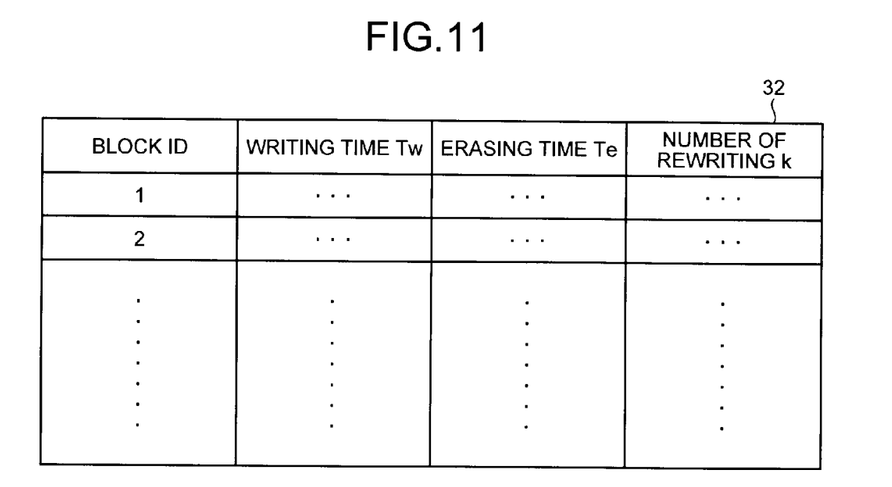
FIG. 11 is a diagram illustrating management data provided in another writing/erasing time management table.
Figure 12:
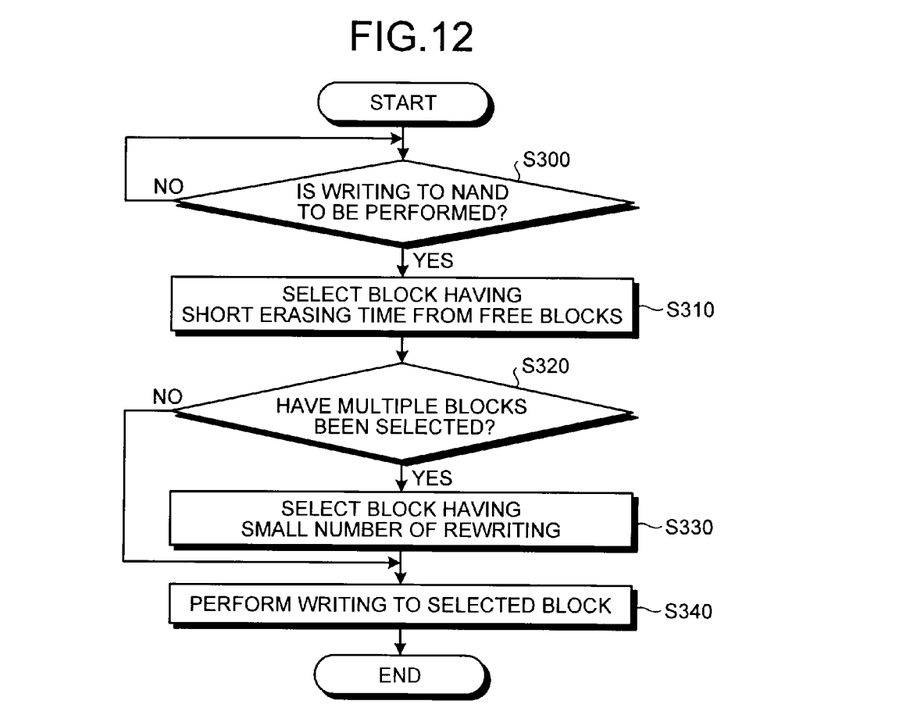
FIG. 12 is a flowchart illustrating another procedure of dynamic wear leveling.

FIG. 10 is a block diagram illustrating a system configuration of another memory system. The memory system illustrated in FIG. 10 differs from the memory system illustrated in FIG. 1 and additionally includes a number of rewriting monitoring unit 16 that monitors the number of rewriting k for a unit of physical blocks. FIG. 11 illustrates another writing/erasing-time management table 32. The writing/erasing-time management table 32 illustrated in FIG. 11 contains, in addition to writing time Tw and erasing time Te, the monitored number (number of writing or erasing) k of rewriting for a unit of physical blocks. FIG. 12 illustrates an operation procedure for dynamic wear leveling by using the management table 32 illustrated in FIG. 11.

If a new data writing request is issued by the host 1 (Step S300), the wear-leveling control unit 14 selects a block having shortest erasing time Te from among unassigned, free physical blocks by referring the management table 32 (Step S310). Subsequently, the wear-leveling control unit 14 determines whether the block having the shortest erasing time Te includes a plurality of blocks (Step S320). If the selected block includes one block (NO at Step S320), the wear-leveling control unit 14 reports the thus-selected one block to the read-write control unit 11. The read-write control unit 11 performs data writing to the thus-reported block having the shortest erasing time Te (Step S340).

In contrast, if it is determined that the block having the shortest erasing time Te includes a plurality of blocks (YES at Step S320), the wear-leveling control unit 14 selects a block of which number of rewriting k is smallest from among the thus-selected plurality of blocks having the shortest erasing time Te by referring the management table (Step S330). Subsequently, the wear-leveling control unit 14 reports the block selected based on the number of rewriting k to the read-write control unit 11. The number of rewriting k can easily differentiate quantitatively degree of fatigue among blocks compared with erasing time Te or writing time Tw. Therefore, it is possible to select easily a block, degree of fatigue of which is small by using the number of rewriting k as the reference. The read-write control unit 11 performs data writing to the thus-reported block (Step S340).

With dynamic wear leveling that uses writing time Tw as the reference for block selection, the block selection can be performed such that if the block selected based on the writing time Tw includes a plurality of blocks, further block selection may be made based on the number of rewriting k. With dynamic wear leveling that uses erasing time Te as the reference for block selection, the block selection can be performed such that if the block selected based on the erasing time Te includes a plurality of blocks, further block selection may be made based on writing time Tw. Similarly, with dynamic wear leveling that uses writing time Tw as the reference for block selection, the block selection can be performed such that if the block selected based on the writing time Tw includes a plurality of blocks, further block selection may be made based on erasing time Te.

Figure 13:
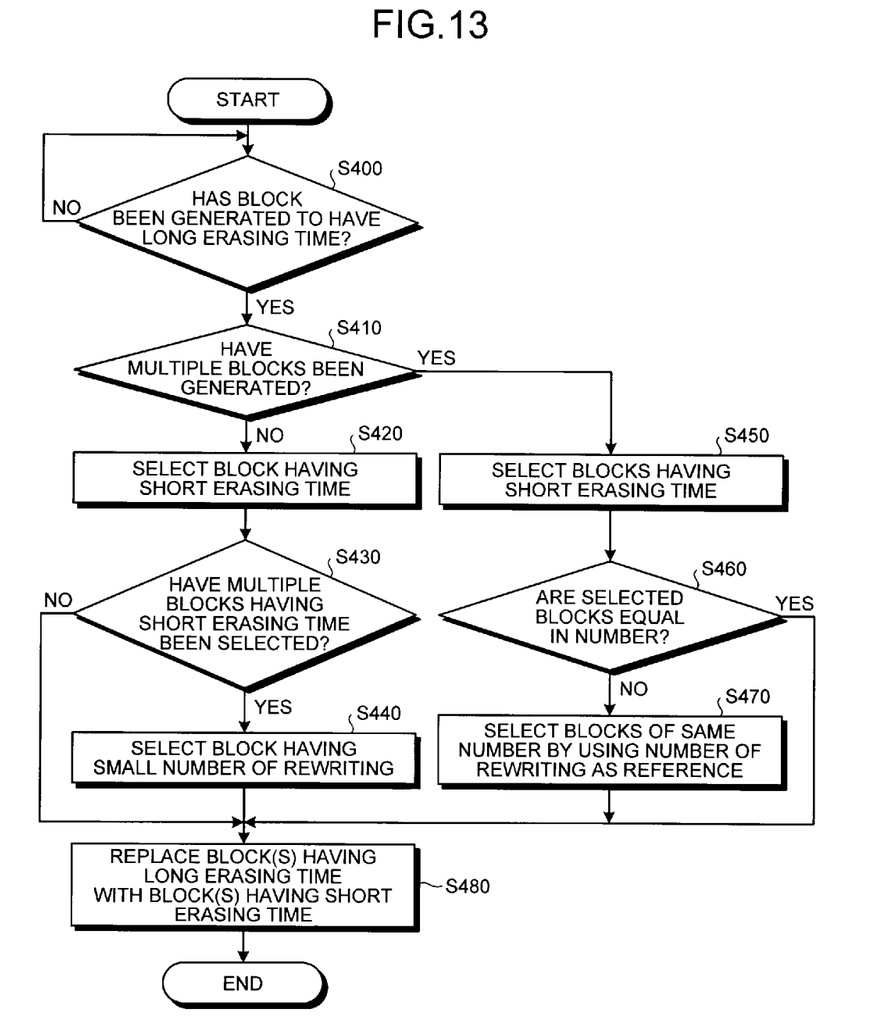
FIG. 13 is a flowchart illustrating another procedure of static wear leveling.

FIG. 13 illustrates an operation procedure for static wear leveling by using the management table 32. The wear-leveling control unit 14 monitors erasing time Te of each of the blocks registered in the writing/erasing-time management table 32, and if it is detected that a block having erasing time Te longer than a predetermined threshold value has generated (Step S400), determines whether the thus-detected block includes a plurality of blocks (Step S410). If the detected block includes one block (NO at Step S410), the wear-leveling control unit 14 selects a block having shortest erasing time Te by referring the management table 32 (Step S420). Subsequently, the wear-leveling control unit 14 determines whether the block selected and having the shortest erasing time Te includes a plurality of blocks (Step S430). If the selected block includes one block (NO at Step S430), the wear-leveling control unit 14 replaces the one block, of which erasing time has exceeded the predetermined threshold value, with the block having the shortest erasing time (Step S480).

If it is determined that the selected block includes a plurality of blocks at Step S430, the wear-leveling control unit 14 selects a block of which number of rewriting k is smallest from among the selected plurality of blocks having the shortest erasing time Te by referring the management table 32 (Step S440). As discussed above, the number of rewriting k can easily differentiate quantitatively degree of fatigue among blocks compared with erasing time Te or writing time Tw. Therefore, it is possible to select easily a block, degree of fatigue of which is small by using the number of rewriting k as the reference. In this case, the one block of which erasing time has exceeded the predetermined threshold value is replaced with the one block selected based on erasing time Te and the number of rewriting k as the reference (Step S480).

In contrast, if it is detected that a plurality of blocks N (N≧2), each of which erasing time Te is longer than a threshold value have generated at Step S410 (Step S410), the wear-leveling control unit 14 sets the N blocks as target blocks of static wear leveling. Specifically, first, the wear-leveling control unit 14 selects N blocks having shorter erasing time Te by referring the management table 32 (Step S450). If it is allowed to select N blocks by using erasing time Te as the reference, the procedure proceeds to Step S480, where the N blocks having long erasing time Te are replaced with the N blocks having shorter erasing time Te.

For instance, there can be a circumstance where the number of blocks having shortest erasing time Te is larger than N or smaller than N, or it is impossible to select N blocks having shorter erasing time Te by using erasing time Te as the reference (NO at Step S460). In such cases, the wear-leveling control unit 14 selects N blocks each having smaller number of rewriting k by referring the management table 32 (Step S470). For instance, when the number of blocks selected by using erasing time Te as the reference is larger than N, N blocks each having smaller number of rewriting k can be selected from among a plurality of blocks selected by using erasing time Te as the reference. When the number of blocks selected by using erasing time Te as the reference is smaller than N, only short number of blocks from N blocks having smaller number of rewriting k are selected, thereby selecting N blocks. In this case, the N blocks, each of which erasing time has exceeded the predetermined threshold value, are replaced with the N blocks having short erasing time selected by using erasing time Te and number of rewriting k as the reference (Step S480).

Meanwhile, with static wear leveling that uses writing time Tw as the reference for block selection, the block selection can be performed such that if the block selected based on writing time Tw includes a plurality of blocks, further block selection may be made based on the number of rewriting. With static wear leveling that uses erasing time Te as the reference for block selection, the block selection can be performed such that if the block selected based on the erasing time Te includes a plurality of blocks, further block selection may be made based on writing time Tw. Similarly, with static wear leveling that uses writing time Tw as the reference for block selection, the block selection can be performed such that if the block selected based on the writing time Tw includes a plurality of blocks, further block selection may be made based on erasing time Te.

The dynamic wear leveling illustrated in FIG. 12 may be performed by using the number of erasing loop and/or the number of writing loop discussed above in place of erasing time Te and/or writing time Tw. Similarly, the static wear leveling illustrated in FIG. 13 may be performed by using the number of erasing loop and/or the number of writing loop discussed above in place of erasing time Te and/or writing time Tw. When it is difficult to determine what resolution is to be used as criterion for determination of "same" time in measurement of erasing time Te or writing time Tw, using the number of erasing loop and/or the number of writing loop allows to make quantitative determination easily. In such a case, as illustrated in FIG. 12 and FIG. 13, a large number of circumstances where a plurality of blocks have shortest erasing time Te or shortest writing time Tw can occur; therefore, block selection by using the number of rewriting count k as the reference is particularly effective.

In measurement of erasing time Te, when one loop cycle is, for instance, 4 milliseconds on average, erasing time Te of blocks will concentrate in the neighborhood of integral multiples of 4 milliseconds. In such a case, it is troublesome to consider blocks, of which erasing time Te is in the neighborhood of 4 milliseconds (e.g., 3.9 milliseconds or 4.1 milliseconds), as having different erasing time Te. Therefore, for instance, an intermediate value of 6 milliseconds between 4 milliseconds, which is erasing time for one loop cycle, and 8 milliseconds, which is erasing time for two loop cycles, can be set as a threshold value. Then, it may be considered that all blocks having erasing time Te equal to or shorter than 6 milliseconds are assumed to have a same erasing time, while, similarly, all blocks having erasing time Te longer than 6 milliseconds are assumed to have a same erasing time. Also, in measurement of writing time Tw, a threshold value can be set by measuring mean time required for one loop cycle, thereby facilitating measurement of writing time Tw.

In the static wear leveling illustrated in FIG. 13, if a plurality of blocks, of which erasing time Te exceeds the threshold value, the static wear leveling may be performed priorly to a block having the larger number of rewriting k. Such control is advantageous in an event where, for instance, wear leveling is suspended due to interruption caused by the host.

Further, in the static wear leveling illustrated in FIG. 13, if a result of determination made at Step S400 is NO, whether to perform the static wear leveling may be determined based on the number of writing k. Making determination as to whether to perform static wear leveling by combining and using at least two of erasing time Te, writing time Tw, and the number of writing k in this manner can lead to the static wear leveling with high precision.

Alternatively, in the static wear leveling, if heavily-worn blocks having long erasing time and short writing time are selected, it is possible to set a criterion, or a threshold value, for use in selection less stringent (setting a relatively short threshold value for erasing time; setting a relatively long threshold value for writing time). This allows selection ranges to the heavily-worn blocks broaden, target blocks for the static wear leveling may be selected from the thus-selected blocks based on the number of rewriting. If less-worn blocks having short erasing time and long writing time are selected, it is possible to broaden the selection range as in a similar manner, and it may be possible to select blocks, from the thus-widened range, to be replaced in the static wear leveling based on the number of rewriting. This allows to perform more accurate wear leveling by utilizing advantages of making selection by using erasing time or writing time as a selection criterion (this allows to accommodate variations among lots, individual pieces, and blocks) and advantages of making selection by using the number of writing as a selection criterion (this allows to quantitatively differentiate among blocks easily).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system monitoring data erasing time, comprising:
    a nonvolatile semiconductor memory including a plurality of blocks, each of the plurality of blocks being a data erasing unit;
    an erasing time monitoring unit configured to monitor elapsed time during erasing data in the non-volatile semiconductor memory;
    an erasing time management unit configured to manage a first management table associating the erasing time with each of the plurality of blocks; and
    a wear-leveling control unit configured to level a number of rewriting across the plurality of blocks based on the first management table.

2. The memory system according to claim 1, further comprising:
    a writing time monitoring unit configured to monitor the elapsed time during writing data in the non-volatile semiconductor memory; and
    a writing time management unit configured to manage a second management table associating the writing time with each of the plurality of blocks.

3. The memory system according to claim 2, wherein in the second management table, a number of applying a program voltage is managed as the writing time.

4. The memory system according to claim 2, further comprising:
    a life managing unit configured to determine whether the nonvolatile semiconductor memory has reached end of life based on the second management table.

5. The memory system according to claim 4, wherein when an average value of a writing time of the plurality of blocks managed in the second management table has become shorter than a threshold value, the life managing unit determines that the nonvolatile semiconductor memory has reached the end of life.

6. The memory system according to claim 4, wherein when a longest writing time among writing times of the plurality of blocks managed in the second management table has become shorter than a predetermined threshold value, the life managing unit determines that the nonvolatile semiconductor memory has reached the end of life.

7. The memory system according to claim 2, further comprising:

a number of rewriting monitoring unit configured to monitor a number of rewriting of each of the plurality of blocks, wherein the second management table associates the number of rewriting with each of the plurality of blocks.

8. The memory system according to claim 7, wherein
when performing data writing, the wear-leveling control unit selects a block having a longest writing time among free blocks, each of the free blocks not containing valid data, and
when a plurality of free blocks have the longest writing time, the wear-leveling control unit selects a free block of which the number of rewriting is smallest.

9. The memory system according to claim 7, wherein
when the erasing time management unit detects a first block, the wear-leveling control unit replaces the first blocks with a second block, the first block having a writing time shorter than a second threshold value, the second block having a longest writing time, and
when a number of the second blocks having the longest writing time is not equal to a number of the first blocks, the wear-leveling control unit selects second blocks of equal number to the number of the first blocks based on writing time and number of rewriting.

10. The memory system according to claim 1, wherein when performing data writing, the wear-leveling control unit selects a block having a shortest erasing time from among free blocks, each of the free blocks not containing valid data.

11. The memory system according to claim 1, wherein when the erasing time management unit detects a first block, the wear-leveling control unit replaces the first block with a second block, wherein
the first block has erasing time longer than a first threshold value, and
the second block has a shortest erasing time among the plurality of blocks.

12. The memory system according to claim 1, wherein when performing data writing, the wear-leveling control unit selects a block having a longest writing time from among free blocks, each of the free blocks not containing valid data.

13. The memory system according to claim 1, wherein when the writing time management unit detects a first block, the wear-leveling control unit replaces the first block with a second block, wherein
the first block has a writing time shorter than a second threshold value, and
the second block has a longest writing time among the plurality of blocks.

14. The memory system according to claim 1, further comprising:
a life managing unit configured to determine whether the nonvolatile semiconductor memory has reached end of life based on the first management table.

15. The memory system according to claim 14, wherein when an average value of erasing time of the plurality of blocks managed in the first management table has become longer than a threshold value, the life managing unit determines that the nonvolatile semiconductor memory has reached the end of life.

16. The memory system according to claim 14, wherein when a shortest erasing time among erasing times of the plurality of blocks managed in the first management table has become longer than a threshold value, the life managing unit determines that the nonvolatile semiconductor memory has reached the end of life.

17. The memory system according to claim 1, further comprising:
a number of rewriting monitoring unit configured to monitor a number of rewriting of each of the plurality blocks, wherein the first management table associates the number of rewriting with each of the plurality of blocks.

18. The memory system according to claim 17, wherein
when performing data writing, the wear-leveling control unit selects a block having a shortest erasing time from among free blocks, each of the free blocks not containing valid data, and
when a plurality of free blocks have the shortest erasing time, the wear-leveling control unit selects a free block of which the number of rewriting is smallest.

19. The memory system according to claim 17, wherein
when the erasing time management unit detects a first block, the wear-leveling control unit replaces the first block with a second block, the first block having erasing time longer than a first threshold value, the second block having a shortest erasing time among the plurality of blocks, and
when a number of the second blocks having the shortest erasing time is not equal to a number of the first blocks, the wear-leveling control unit selects second blocks of equal number to the number of the first blocks based on the erasing time and the number of rewriting.

20. A memory system monitoring data writing time comprising:
a nonvolatile semiconductor memory including a plurality of blocks, each of the plurality of blocks being a data erasing unit;
a writing time monitoring unit configured to monitor elapsed time during writing data in the nonvolatile semiconductor memory;
a writing time management unit configured to manage a management table associating the writing time with each of the plurality of blocks; and
a wear-leveling control unit configured to level a number of rewriting across the plurality of blocks based on the management table.

* * * * *